United States Patent
Chen et al.

(10) Patent No.: US 9,628,054 B1
(45) Date of Patent: Apr. 18, 2017

(54) CURRENT-MODE LOGIC LATCH CIRCUIT

(71) Applicants: GLOBAL UNICHIP CORPORATION, Hsinchu (TW); TAIWAN SEMICONDUCTOR MANUFACTURING CO., LTD., Hsin-Chu (TW)

(72) Inventors: Yen-Chung Chen, Santa Clara, CA (US); Tsai-Ming Yang, Hsinchu (TW); Yi-Lin Lee, Hsinchu (TW)

(73) Assignees: GLOBAL UNICHIP CORPORATION, Hsinchu (TW); TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/989,517

(22) Filed: Jan. 6, 2016

(51) Int. Cl.
*H03K 3/356* (2006.01)
*H03K 3/012* (2006.01)

(52) U.S. Cl.
CPC ....... *H03K 3/356017* (2013.01); *H03K 3/012* (2013.01)

(58) Field of Classification Search
CPC ...... H03K 3/037; H03K 3/356; H03K 3/0233; H03K 3/356043
USPC ........ 327/212, 218, 208, 198, 215, 108–112, 327/427, 434, 437, 202, 199, 203, 211, 327/214; 326/82, 83, 87
See application file for complete search history.

(56) References Cited

U.S. PATENT DOCUMENTS

| | | | |
|---|---|---|---|
| 7,521,976 B1 | 4/2009 | Sudjian et al. | |
| 8,538,362 B2 | 9/2013 | Srivastava et al. | |
| 8,552,779 B2 | 10/2013 | Jones et al. | |
| 8,698,532 B2 | 4/2014 | Raghavan | |
| 2008/0265970 A1* | 10/2008 | Vlasenko | H03L 7/0812 327/333 |
| 2013/0127507 A1* | 5/2013 | Zhuang | H03K 3/35625 327/203 |

OTHER PUBLICATIONS

Taiwan Intellectual Property Office, "Office Action", issued on Oct. 18, 2016.

* cited by examiner

*Primary Examiner* — Thomas Skibinski
(74) *Attorney, Agent, or Firm* — WPAT, PC; Justin King

(57) ABSTRACT

A latch circuit including a symmetric circuit, a clock receiving circuit, a current generating circuit, a sampling circuit and a holding circuit is provided. The clock receiving circuit receives a first clock signal and a second clock signal. A phase difference between the first clock signal and the second clock signal is 180 degrees. The current generating circuit is electrically connected with the symmetric circuit and the clock receiving circuit, for providing a discharge current. The sampling circuit is electrically connected with the current generating circuit. According to the first clock signal, the sampling circuit receives a differential input signal, and the discharge current flows through the sampling circuit. The holding circuit is electrically connected with the current generating circuit. According to the second clock signal, the discharge current flows through the holding circuit, and the holding circuit generates a differential output signal.

10 Claims, 5 Drawing Sheets

CURRENT-MODE LOGIC LATCH CIRCUIT

FIELD OF THE INVENTION

The present invention relates to a latch circuit, and more particularly to a current-mode logic latch circuit.

BACKGROUND OF THE INVENTION

Generally, the applications of high-speed latches and flip-flops are widespread. In designing digital circuits, high-speed latches and flip-flops are widely used for sampling and storing/holding data. For example, a current-mode logic latch circuit (also referred hereinafter as a latch circuit) is widely-used because the differential architecture of the latch circuit can increase the operating speed and reject the common mode noise. Since the trends of designing circuits are toward miniaturization and high frequency application, it is important for the latch circuit to accurately sample and latch input signals.

SUMMARY OF THE INVENTION

The present invention provides a latch circuit for reducing the influence of the instantaneous switching between the clock signals.

An embodiment of the present invention provides a latch circuit. The latch circuit includes a symmetric circuit, a clock receiving circuit, a current generating circuit, a sampling circuit and a holding circuit. The clock receiving circuit receives a first clock signal and a second clock signal. A phase difference between the first clock signal and the second clock signal is 180 degrees apart. The current generating circuit is electrically connected with the symmetric circuit and the clock receiving circuit, and providing a discharge current. The sampling circuit is electrically connected with the current generating circuit. According to the first clock signal, the sampling circuit receives a differential input signal and the discharge current flows through the sampling circuit. The holding circuit is electrically connected with the current generating circuit. According to the second clock signal, the discharge current flows through the holding circuit, and the holding circuit regenerates and holds the differential output signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
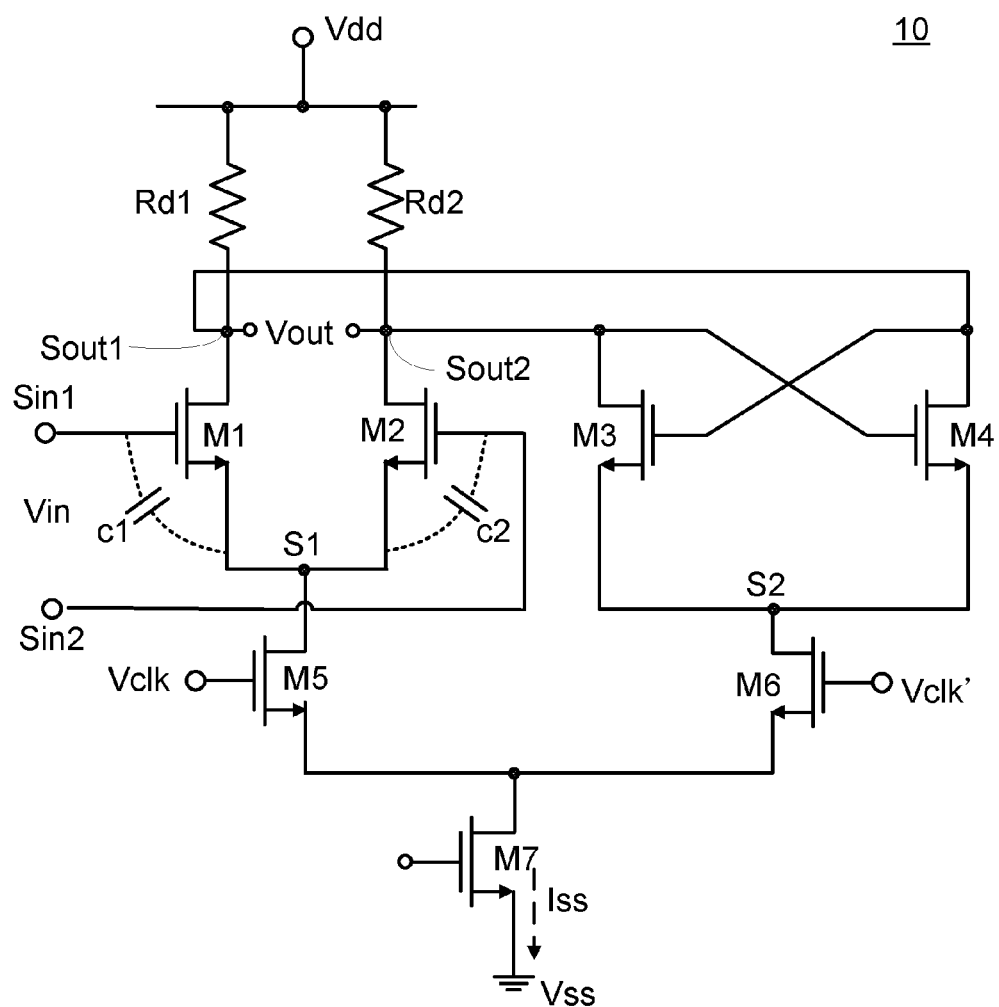
FIG. 1 is a schematic circuit diagram of a current-mode logic latch circuit.

FIG. 1 is a schematic circuit diagram of a current-mode logic latch circuit. The current-mode logic latch circuit 10 includes plural transistors (switch elements) M1, M2, M3, M4, M5, M6 and M7. A resistor Rd1 is connected between a supply voltage Vdd and the drain terminal of the transistor M1. A resistor Rd2 is connected between the supply voltage Vdd and the drain terminal of the transistor M2. In this embodiment, the resistance of the resistor Rd1 and the resistance of the resistor Rd2 are equal.

The transistors M1 and M2 have a differential configuration, and are cross-coupled to the transistors M3 and M4. The drain terminal of the transistor M1 is connected with the drain terminal of the transistor M4 and the gate terminal of the transistor M3. The drain terminal of the transistor M2 is connected with the drain terminal of the transistor M3 and the gate terminal of the transistor M4.

In FIG. 1, a sampling circuit is defined by the transistors M1 and M2 collaboratively, and a holding circuit is defined by the transistors M3 and M4 collaboratively. The transistor M5 receives a first clock signal Vclk, and the transistor M6 receives a second clock signal Vclk'. The phase difference between the first clock signal Vclk and the second clock signal Vclk' is equal to 180 degrees. According to the first clock signal Vclk and the second clock signal Vclk', the latch circuit 10 is selectively operated in a sampling mode or a holding mode. Moreover, the transistor M7 is used as a current source for providing a stable discharge current Iss. Moreover, a first input node Sin1 and a second input node Sin2 receive a first input signal and a second complementary differential input signal, respectively. The first input signal and the second input signal are collaboratively formed as a differential input signal Vin.

In case that the first clock signal Vclk is in a high level state (that is Vclk=1), the transistor M5 is turned on. Under this circumstance, the discharge current Iss from the transistor M7 completely flows through the sampling circuit. Meanwhile, the latch circuit 10 is operated in the sampling mode. In the sampling mode, the transistors M1 and M2 of the sampling circuit sense and track the differential input signal Vin.

In case that the first clock signal Vclk is in a low level state (that is Vclk=0) and the second clock signal Vclk' is in a high level state (that is, Vclk'=1), the transistor M6 is turned on. Under this circumstance, the discharge current Iss from the transistor M7 completely flows through the holding circuit. Meanwhile, the latch circuit 10 is operated in the holding mode. In the holding mode, the holding circuit (that is, the transistors M3 and M4) samples the outputs of the sampling circuit (that is, the transistors M1 and M2).

In this context, the differential input signal Vin is defined as a voltage difference between the voltage of the first input node Sin1 and the voltage of the second input node Sin2. If the voltage of the first input node Sin1 is higher than the voltage of the second input node Sin2, the differential input signal Vin is a positive voltage. If the voltage of the first input node Sin1 is lower than the voltage of the second input node Sin2, the differential input signal Vin is a negative voltage. The voltage difference between a first output node Sout1 of the latch circuit and a second output node Sout2 of the latch circuit is defined as a differential output voltage Vout.

Hereinafter, the operations of the latch circuit 10 in the sampling mode and the holding mode will be illustrated by referring to the following two situations. In the first situation, the differential input signal Vin has the positive voltage (that is, the voltage of the first input node Sin1 is higher than the voltage of the second input node Sin2). In the second situation, the differential input signal Vin has the negative voltage (that is, the voltage of the first input node Sin1 is lower than the voltage of the second input node Sin2). Moreover, the symbol "ON" indicates that the transistor is turned on, the symbol "OFF" indicates that the transistor is turned off, the symbol "H" indicates that the logic level is 1 (that is, the high voltage level), and the symbol "L" indicates that the logic level is 0 (that is, the low voltage level).

Firstly, the first situation will be described. Table 1 shows the relationship between the voltages of the nodes and the on/off statuses of the transistors of the sampling circuit in the sampling mode when the differential input signal Vin has the positive voltage.

TABLE 1

| Sampling mode (Transistor M5 is turned on) | |
| --- | --- |
| Voltage of the first input node Sin1 | H |
| Transistor M1 | ON |
| Voltage of the second input node Sin2 | L |
| Transistor M2 | OFF |
| Voltage of the first output node Sout1 | L |
| Voltage of the second output node Sout2 | H |

Since the voltage of the first input node Sin1 is higher, the transistor M1 is turned on. Under this circumstance, the discharge current Iss flows through the transistor M1. Consequently, the voltage of the drain terminal of the transistor M1 (that is, the first output node Sout1) drops from the higher voltage level (Vdd) to the lower voltage level (Vdd−Iss×Rd). On the other hand, since the voltage of the second input node Sin2 is lower, the transistor M2 is turned off. Under this circumstance, no current flows through the transistor M2. Consequently, the voltage of the second output node Sout2 connected with the drain terminal of the transistor M2 is maintained at the high voltage level (Vdd).

After the sampling circuit samples the differential input signal Vin and generates voltages at the first output node Sout1 and the second output node Sout2, the sampling circuit maintains/tracks the data of the previous stage. Then, the second clock signal Vclk' is switched to the high level state, so that the latch circuit 10 is in the holding mode. Table 2 shows the relationship between the voltages of the nodes and the on/off statuses of the transistors of the holding circuit in the holding mode when the differential input signal Vin has the positive voltage.

TABLE 2

| Holding mode (Transistor M6 is turned on) | |
| --- | --- |
| Voltage of the first output node Sout1 | L |
| Transistor M3 | OFF |
| Voltage of the second output node Sout2 | H |
| Transistor M4 | ON |

In the beginning of the holding mode, the voltage of the first output node Sout1 has the lower voltage level (Vdd−Iss×Rd), and the voltage of the second output node Sout2 has the higher voltage level (Vdd). Since the gate terminal of the transistor M3 is connected with the first output node Sout1, the transistor M3 is turned off. At the same time, the voltage of the second output node Sout2 is maintained at the higher voltage level (Vdd). Moreover, since the gate terminal of the transistor M4 is connected with the second output node Sout2, the transistor M4 is turned on. Consequently, the voltage of the first output node Sout1 is maintained at the lower voltage level (Vdd−Iss×Rd).

Secondly, the second situation will be described. Table 3 shows the relationship between the voltages of the nodes and the on/off statuses of the transistors of the sampling circuit in the sampling mode when the differential input signal Vin has the negative voltage.

TABLE 3

| Sampling mode (Transistor M5 is turned on) | |
| --- | --- |
| Voltage of the first input node Sin1 | L |
| Transistor M1 | OFF |
| Voltage of the second input node Sin2 | H |
| Transistor M2 | ON |
| Voltage of the first output node Sout1 | H |
| Voltage of the second output node Sout2 | L |

Since the voltage of the first input node Sin1 is lower, the transistor M1 is turned off. Under this circumstance, no current flows through the transistor M1. Consequently, the voltage of the drain terminal of the transistor M1 (that is, the first output node Sout1) is maintained at the higher voltage level (Vdd). On the other hand, since the voltage of the second input node Sin2 is higher, the transistor M2 is turned on. Under this circumstance, the discharge current Iss flows through the transistor M2. Consequently, the voltage of the drain terminal of the transistor M2 (that is, the second output node Sout2) drops from the higher voltage level (Vdd) to the lower voltage level (Vdd−Iss×Rd).

After the sampling circuit samples the differential input signal Vin and generates voltages at the first output node Sout1 and the second output node Sout2, the sampling circuit tracks the data of the previous stage (that is the tracking period). Then, the second clock signal Vclk' is switched to the high level state, so that the latch circuit 10 is in the holding mode. Table 4 shows the relationship between the voltages of the nodes and the on/off statuses of the transistors of the holding circuit in the holding mode when the differential input signal Vin has the negative voltage.

TABLE 4

Holding mode
(Transistor M6 is turned on)

| | |
|---|---|
| Voltage of the first output node Sout1 | H |
| Transistor M3 | ON |
| Voltage of the second output node Sout2 | L |
| Transistor M4 | OFF |

In the beginning of the holding mode, the voltage of the first output node Sout1 has higher voltage level (Vdd), and the voltage of the second output node Sout2 has the lower voltage level (Vdd−Iss×Rd). Since the gate terminal of the transistor M3 is connected with the first output node Sout1, the transistor M3 is turned on. At the same time, the voltage of the second output node Sout2 is maintained at the lower voltage level (Vdd−Iss×Rd). Moreover, since the gate terminal of the transistor M4 is connected with the second output node Sout2, the transistor M4 is turned off. Consequently, the voltage of the first output node Sout1 is maintained at the higher voltage level (Vdd).

However, the operations of the latch circuit 10 are adversely affected by the gate-source capacitance c1 between the node S1 and the first input node Sin1 and the gate-source capacitance C2 between the node S1 and the second input node Sin2. When the transistor M1 is turned off, a bypass current possibly flows through the gate-source capacitance c1 between the node S1 and the first input node Sin1. Consequently, the voltage of the first input node Sin1 is influenced. Similarly, even if the transistor M2 is turned off, a bypass current possibly flows through the gate-source capacitance c2 between the node S1 and the second input node Sin2. Consequently, the voltage of the second input node Sin2 is influenced. In other words, the differential input signal Vin is interfered.

As mentioned above, the instantaneous switching between the clock signals Vclk and Vclk' has a coupling influence on the first input node Sin1 and the second input node Sin2, and thus the differential input signal Vin sampled by the sampling circuit is interfered. For example, kick back noise is generated. Due to the kick back noise, the differential output signal Vout latched and generated by the latch circuit 10 is subjected to deviation. If the voltage of the differential input signal Vin is decreased and the switching frequency of the clock signals Vclk and Vclk' is increased, the deviation of the differential output signal Vout is more serious.

Figure 2A:
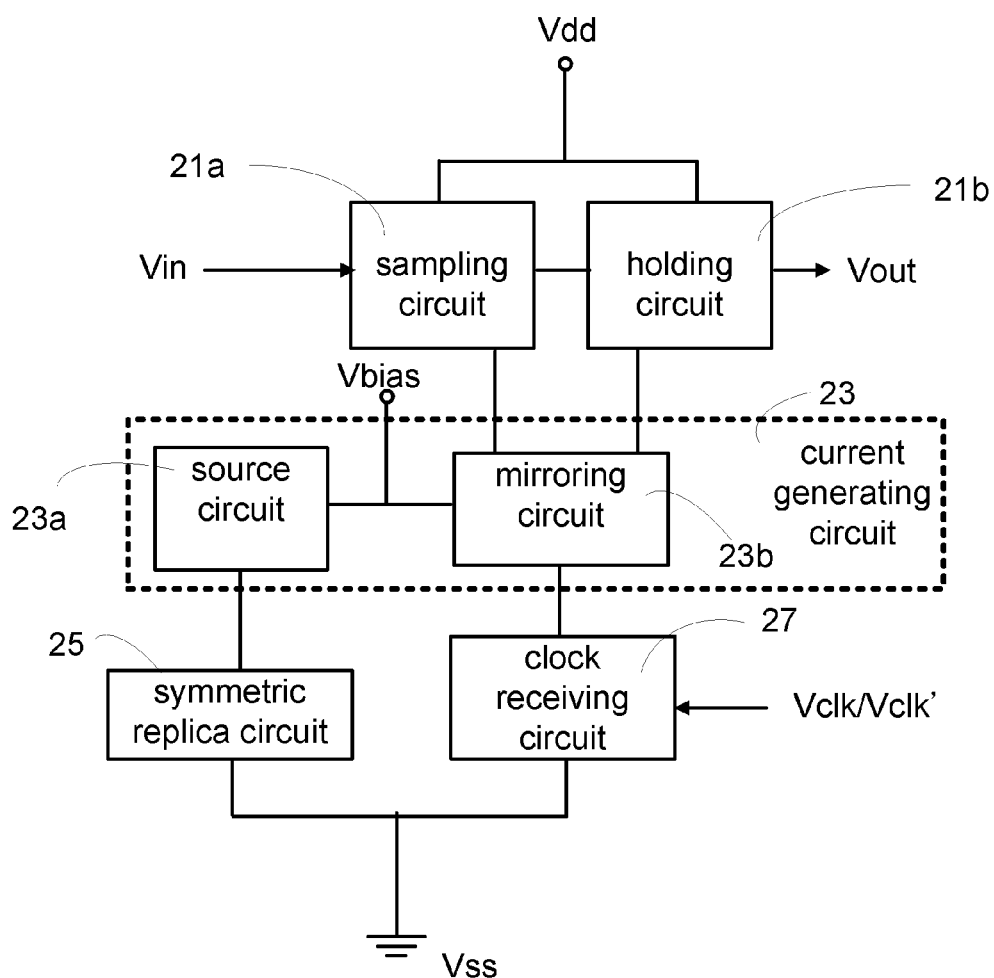
FIG. 2A is a schematic circuit block diagram illustrating a current-mode logic latch circuit according to an embodiment of the present invention.

FIG. 2A is a schematic circuit block diagram illustrating a current-mode logic latch circuit according to an embodiment of the present invention. As shown in FIG. 2A, the latch circuit 20 includes a sampling circuit 21a, a holding circuit 21b, a current generating circuit 23, a clock receiving circuit 27 and a symmetric replica circuit 25 (symmetric circuit). The current generating circuit 23 further includes a source circuit 23a and a mirroring circuit 23b. The symmetric replica circuit 25 and the clock receiving circuit 27 are connected with a ground voltage Vss. The symmetric replica circuit 25 is continuously turned on. Consequently, the source circuit 23a and a mirroring circuit 23b are based on the same reference voltage (Vref).

The sampling circuit 21a and the holding circuit 21b are connected with each other, and connected with a supply voltage Vdd. The sampling circuit 21a receives a differential input signal Vin. The holding circuit 21b generates a differential output signal Vout.

The source circuit 23a and the mirroring circuit 23b of the current generating circuit 23 receive a bias voltage Vbias. A mirror current in the mirroring circuit 23b is determined by referring to a source current in the source circuit 23a. The design of the source circuit 23a and the mirroring circuit 23b do not have to be completely identical, and the person having ordinary skill in the art is able to modify the design of the source circuit 23a and the mirroring circuit 23b. Typically, the source current is smaller than the mirror current by a factor of N, which can be equal or 0.5, 0.1 . . . or 0.05. The source circuit 23a is electrically connected with the symmetric replica circuit 25. The mirroring circuit 23b is electrically connected with the sampling circuit 21a, the holding circuit 21b and the clock receiving circuit 27.

Figure 2B:
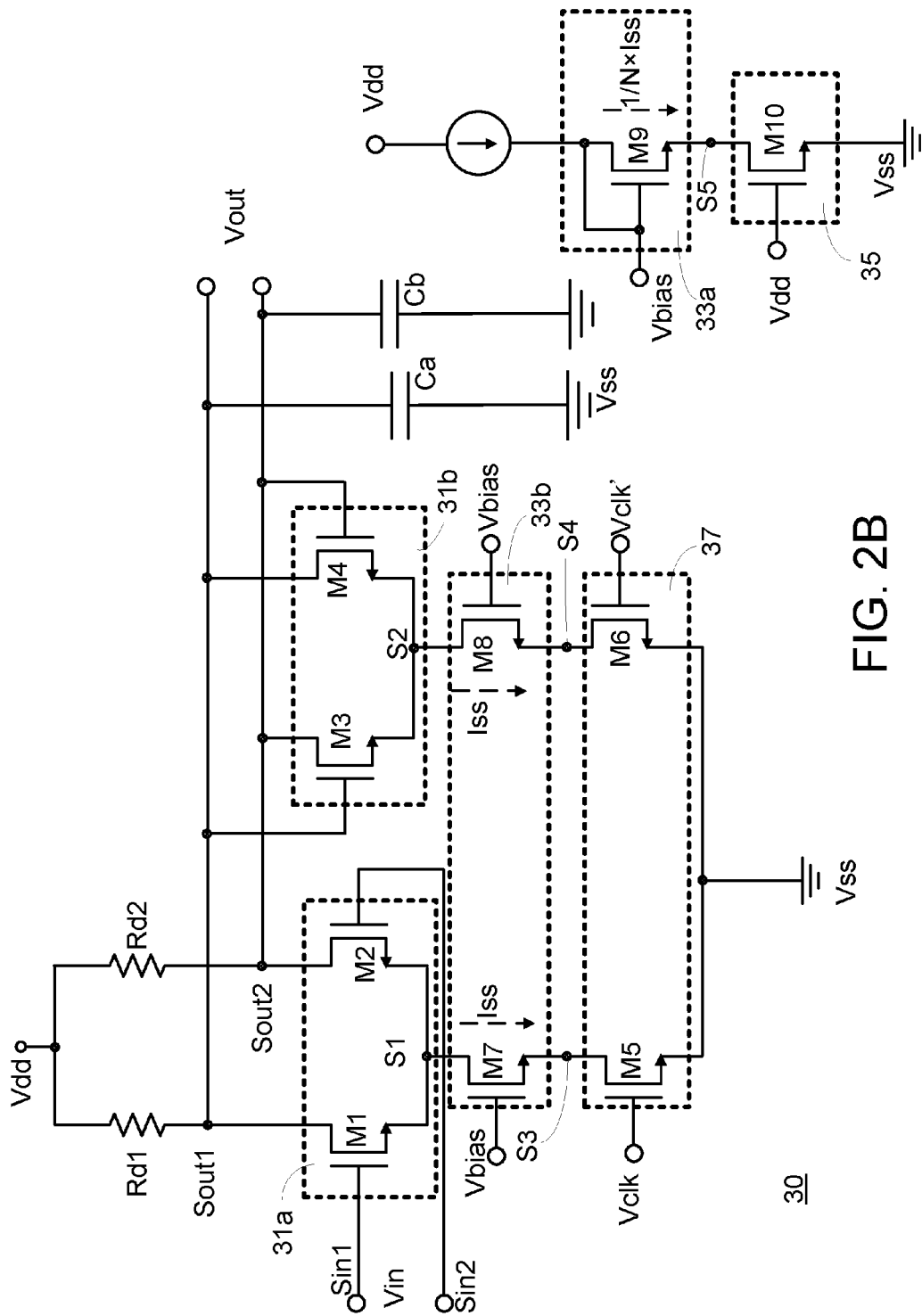
FIG. 2B is a schematic circuit diagram illustrating the current-mode logic latch circuit with the circuitry architecture of FIG. 2A.

FIG. 2B is a schematic circuit diagram illustrating the current-mode logic latch circuit with the circuitry architecture of FIG. 2A. As shown in FIG. 2B, the latch circuit 30 includes a sampling circuit 31a, a holding circuit 31b, a current generating circuit 33, a clock receiving circuit 37 and a symmetric replica circuit 35. The sampling circuit 31a is operated in a sampling mode, and the holding circuit 31b is operated in a holding mode. In addition, some parasitic capacitors Ca, Cb may exist in the latch circuit.

The sampling circuit 31a includes transistors M1 and M2 for receiving the differential input signal Vin. The holding circuit 31b includes transistors M3 and M4. The operations of the sampling circuit 31a and the holding circuit 31b are similar to those of the latch circuit 10 of FIG. 1, and are not redundantly described herein.

The current generating circuit 33 includes a source circuit 33a and a mirroring circuit 33b. The source circuit 33a is used for generating the source current having a current value of 1/N×Iss. The mirroring circuit 33b generates the mirror current having a current value of Iss. In the latch circuit 30, the current generating circuit 33 is not directly connected with the ground voltage Vss. Instead, the mirroring circuit 33b of the current generating circuit 33 is connected between the sampling circuit 31a, the holding circuit 31b and the clock receiving circuit 37.

The source circuit 33a includes a transistor M9. The drain terminal and the gate terminal of the transistor M9 are connected with each other, and receive a bias voltage Vbias. The mirroring circuit 33b includes transistors M7 and M8. The transistor M7 is electrically connected with the sampling circuit 31a. Moreover, according to the bias voltage Vbias, the transistor M7 is turned on, and a first mirror current is generated. The transistor M8 is electrically connected with the holding circuit 31b. According to the bias voltage Vbias, the transistor M8 is turned on, and a second mirror current is generated. The current value (Iss) of the first mirror current and the second mirror current are substantially equal to multiple of the current value (1/N×Iss) of the source current.

The clock receiving circuit 37 includes transistors M5 and M6. In case that the first clock signal Vclk is in the high level state, the transistor M5 is turned on, and the transistor M6 is turned off. Meanwhile, the first mirror current is used as the discharge current Iss. The discharge current Iss flows from the supply voltage Vdd to the ground voltage source Vss through the sampling circuit 31a, the transistor M7 and the transistor M5. Under this circumstance, the latch circuit 30 is in the sampling mode.

In case that the second clock signal Vclk' is in the high level state, the transistor M5 is turned off, and the transistor M6 is turned on. Meanwhile, the second mirror current is used as the discharge current Iss. The discharge current Iss flows from the supply voltage Vdd to the ground voltage Vss through the holding circuit 31b, the transistor M8 and the transistor M6. Under this circumstance, the latch circuit 30 is in the holding mode.

The symmetric replica circuit 35 is connected between the source circuit 33a and the ground voltage Vss. By means of the transistor of the symmetric replica circuit 35, operation of the transistors M9, M7 and M8 are based on the same reference voltage (Vref). That is, voltage of the nodes S3, S4, and S5 can be maintained at the reference voltage (Vref). Consequently, the symmetric current mirror configuration is formed. As shown in FIG. 2B, the symmetric replica circuit 35 includes a transistor M10. The drain terminal of the transistor M10 is electrically connected with the source terminal of the transistor M9. The gate terminal of the transistor M10 is electrically connected with the supply voltage Vdd. The source terminal of the transistor M10 is electrically connected with the ground voltage Vss. Consequently, the transistor M10 is continuously turned on, and the voltage of node S5 is equal to the reference voltage (Vref).

Because the transistor M10 is always turned on, operation of the source circuit 33a is consistently based on the voltage difference between the drain terminal and the source terminal of the transistor M10. Because the transistors M5 and M6 are alternately turned on, operation of the mirroring circuit 33b is either based on the voltage difference between the drain terminal and the source terminal of the transistor M5 or that of the transistor M6. Thus, the voltage of nodes S3 and S4 are alternately equal to the reference voltage (Vref).

When the latch circuit 30 is in the sampling mode, the transistor M5 is turned on and the transistor M6 is turned off. Consequentially, the voltage of node S3 is equal to the reference voltage (Vref). Under this circumstance, the operation of the mirroring circuit 33b is based on the voltage difference of the drain terminal and the source terminal of the transistor M5 when the latch circuit 30 is in the sampling mode.

On the other hand, when the latch circuit 30 is in the holding mode, the transistor M5 is turned off and the transistor M6 is turned on. Consequentially, the voltage of node S4 is equal to the reference voltage (Vref). Under this circumstance, the operation of the mirroring circuit 33b is based on the voltage difference between the drain terminal and the source terminal of the transistor M6 when the latch circuit 30 is in the holding mode.

Therefore, in the latch circuit 30, operation of the source circuit 33a and the mirroring circuit 33b are both based on the same reference voltage (Vref), that is, a voltage difference between a drain terminal and a source terminal of a conducted transistor.

In this embodiment, the clock receiving circuit 37 is not directly connected with the sampling circuit 31a and the holding circuit 31b. Instead, the clock receiving circuit 37 is indirectly connected with the sampling circuit 31a and the holding circuit 31b through the mirroring circuit 33b. In other words, the mirroring circuit 33b is used for providing the shielding and isolating efficacy. Consequently, the influence of the instantaneous switching between the clock signals Vclk and Vclk' on the differential input signal Vin will be minimized. By means of the transistor M7, the coupling influence of the first clock signal Vclk on the transistors M1 and M2 of the sampling circuit 31a is minimized. By means of the transistor M8, the coupling influence of the second clock signal Vclk' on the transistors M3 and M4 of the holding circuit 31b is minimized.

Figure 3:
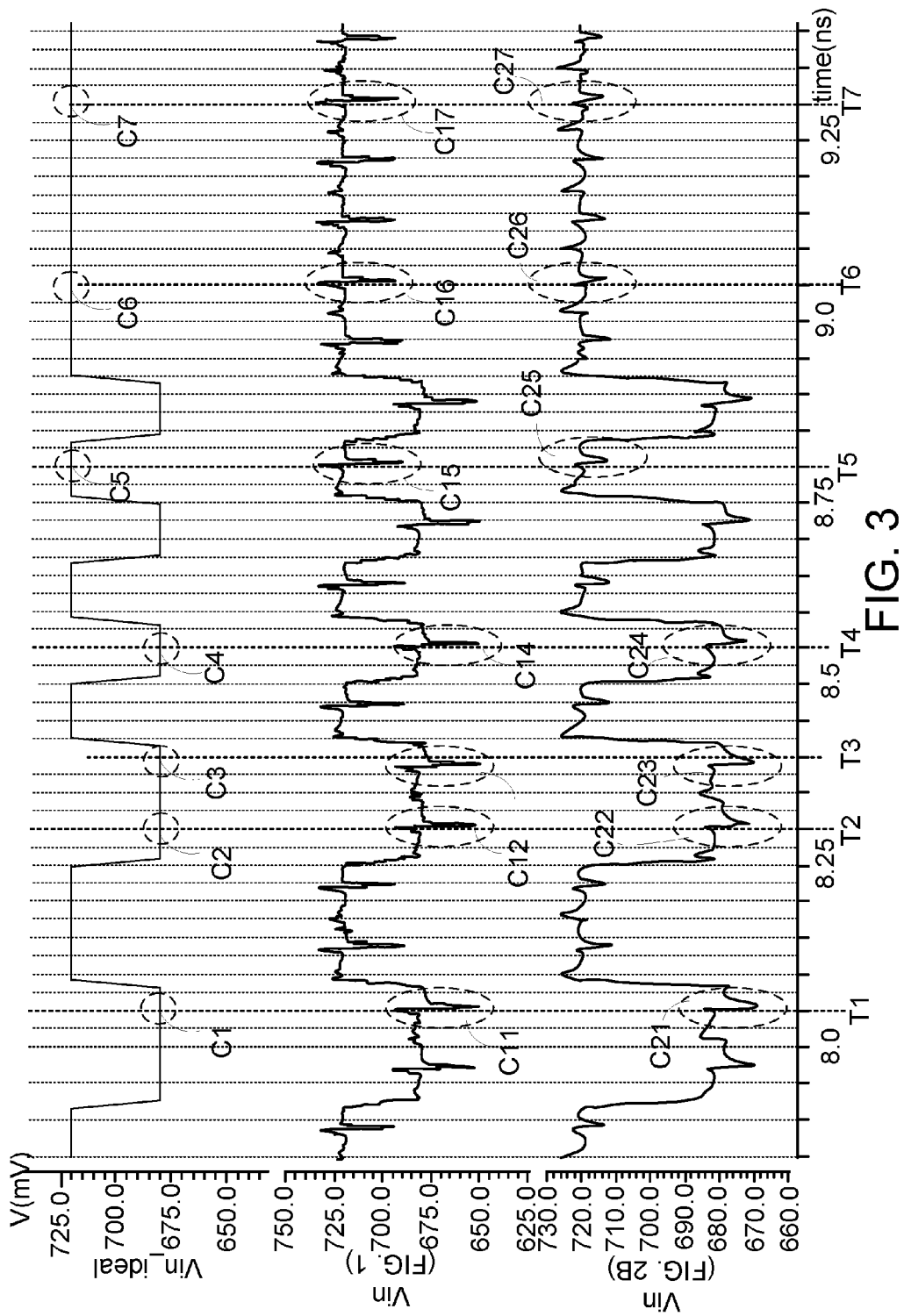
FIG. 3 is a schematic timing waveform diagram illustrating an ideal differential input signal, the differential input signal processed by the latch circuit of FIG. 1 and the differential input signal processed by the current-mode logic latch circuit of FIG. 2B.

FIG. 3 is a schematic timing waveform diagram illustrating an ideal differential input signal, the differential input signal processed by the latch circuit of FIG. 1 and the differential input signal processed by the current-mode logic latches circuits of FIG. 2B. In the drawings, the dotted regions indicate that the clock signal Vclk/Vclk' is switched from the high level state to the low level state or switched from the low level state to the high level state. It is found that the instantaneous switching results in the kick back noise of the differential input signal Vin.

At the time points T1, T2, T3 and T4, the differential input signal Vin is in the low level state. At the time point T1, the voltage of the ideal differential input signal Vin_ideal is 675 mV (segment C1). The instantaneous switching of the clock signal Vclk/Vclk' may result in the kick back noise. For example, at the time point T1, the voltage of the differential input signal processed by the latch circuit 10 of FIG. 1 fluctuates between 695 mV and 640 mV (segment C11). That is, the fluctuation voltage range of the differential input signal Vin for the latch circuit 10 is about 45 mV. Moreover, at the time point T1, the voltage of the differential input signal processed by the latch circuit 30 of FIG. 2B fluctuates between 684 mV and 668 mV (segment C21). That is, fluctuation voltage range of the differential input signal Vin for the latch circuit 30 is about 16 mV.

At the time points T2, T3 and T4, the voltage of the ideal differential input signal Vin_ideal remains at 675 mV (segments C2, C3 and C4). Meanwhile, the fluctuation voltage range of the differential input signal Vin for the latch circuit 10 is about 50 mV (segments C12, C13 and C14). At the time points T2, T3 and T4, the fluctuation voltage range of the differential input signal Vin for the latch circuit 30 is about 15 mV (segments C22, C23 and C24). When compared with the influence of the instantaneous switching of the clock signal Vclk/Vclk' on the differential input signal Vin of the latch circuit 10, the influence of the instantaneous switching of the clock signal Vclk/Vclk' on the differential input signal Vin of the latch circuit 30 is largely reduced. In other words, the circuitry of FIG. 2B is capable of reducing the influence of the instantaneous switching of the clock signal Vclk/Vclk' on the low voltage level of the differential input signal Vin by using the current generating circuit to reduce the influence of the clock receiving circuit.

At the time points T5, T6 and T7, the differential input signal Vin is in the high level state. At the time point T5, the voltage of the ideal differential input signal Vin_ideal is 720 mV (segment C5).

The instantaneous switching of the clock signal Vclk/Vclk' result in the kick back noise. For example, at the time point T5, the voltage of the differential input signal Vin for the latch circuit 10 fluctuates between 690 mV and 730 mV (segment C15). That is, at the time point T5, the fluctuation voltage range of the differential input signal Vin for the latch circuit 10 is about 40 mV. Moreover, at the time point T5, the voltage of the differential input signal for the latch circuit 30 fluctuates between 710 mV and 722 mV (segment C25). That is, the fluctuation voltage range of the differential input signal Vin for the latch circuit 30 is about 12 mV. In other words, the latch circuit 30 can reduce the influence of the instantaneous switching of the clock signal Vclk/Vclk' on the differential input signal Vin.

At the time points T6 and T7, the voltage of the ideal differential input signal Vin_ideal remains at 720 mV (segments C6 and C7). Meanwhile, the fluctuation voltage range of the differential input signal Vin for the latch circuit 10 is about 30 mV (segments C16 and C17). At the time points T6 and T7, the fluctuation voltage range of the differential input signal Vin for the latch circuit 30 is about 15 mV (segments C26 and C27).

When compared with the influence of the instantaneous switching of the clock signal Vclk/Vclk' on the differential input signal Vin of the latch circuit 10, the influence of the instantaneous switching of the clock signal Vclk/Vclk' on the differential input signal Vin of the latch circuit 30 is largely reduced. In other words, the circuitry of FIG. 2B is capable of reducing the influence of the instantaneous switching of the clock signal Vclk/Vclk' on the high voltage level of the differential input signal Vin by using the current generating circuit to reduce the influence of the clock receiving circuit.

Figure 4:
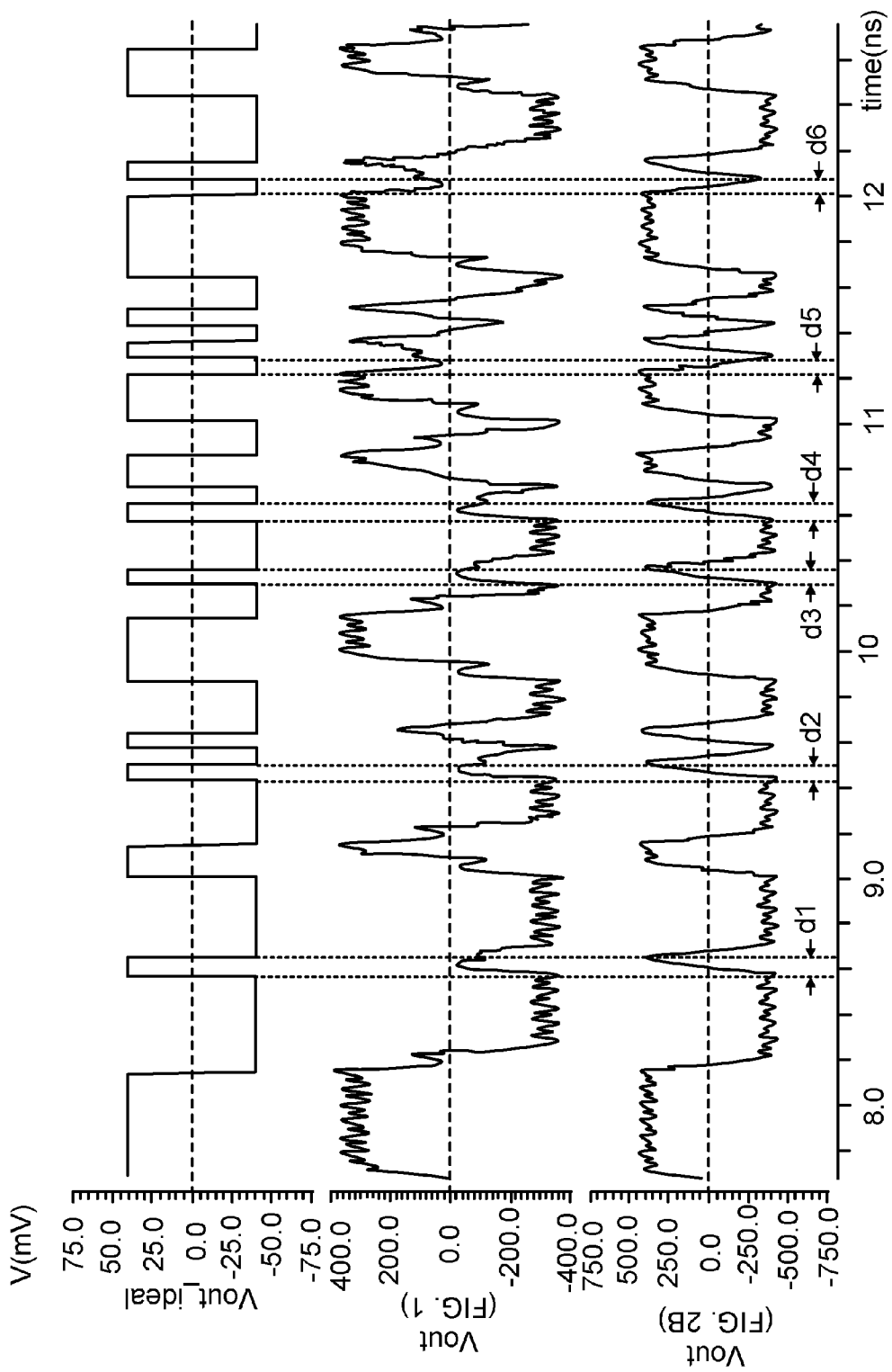
FIG. 4 is a schematic timing waveform diagram illustrating an ideal differential output signal, the differential output signal generated by the latch circuit of FIG. 1 and the differential output signal generated by the current-mode logic latch circuit of FIG. 2B.

FIG. 4 is a schematic timing waveform diagram illustrating an ideal differential output signal, the differential output signal generated by the latch circuit of FIG. 1 and the differential output signal generated by the latch circuit of FIG. 2B. The waveform shown in FIG. 4 is obtained by a sampling flip-flop which is built as a pair of back-to-back latches with opposite sampling clock phase connections.

In the time interval d1, the voltage of the ideal differential output signal Vout_ideal is higher than 0V. That is, the logic level of the ideal differential output signal Vout_ideal is 1. In the time interval d1, the voltage of the differential output signal Vout for the latch circuit 10 is lower than 0V. That is, the logic level of the differential output signal Vout is "0". In the time interval d1, the voltage of the differential output signal Vout for the latch circuit 30 is higher than 0V. That is, the logic level of the differential output signal Vout is "1". That is, in the time interval d1, the latch circuit 10 erroneously generates the logic level of the differential output signal Vout, but the latch circuit 30 accurately generates the logic level of the differential output signal Vout. Similarly, in the time intervals d2, d3 and d4, the latch circuit 10 also erroneously generates the logic level of the differential output signal Vout, but the latch circuit 30 accurately generates the logic level of the differential output signal Vout.

In the time interval d5, the voltage of the ideal differential output signal Vout_ideal is lower than 0V. That is, the logic level of the ideal differential output signal Vout_ideal is "0". In the time interval d5, the voltage of the differential output signal Vout for the latch circuit 10 is higher than 0V. That is, the logic level of the differential output signal Vout is "1". In the time interval d5, the voltage of the differential output signal Vout for the latch circuit 30 is lower than 0V. That is, the logic level of the differential output signal Vout is "0". That is, in the time interval d5, the latch circuit 10 erroneously generates the logic level of the differential output signal Vout, but the latch circuit 30 accurately generates the logic level of the differential output signal Vout. Similarly, in the time interval d6, the latch circuit 10 also erroneously generates the logic level of the differential output signal Vout, but the latch circuit 30 accurately generates the logic level of the differential output signal Vout. According to the result of FIG. 4, it is found that the differential output signal Vout generated by the latch circuit 30 has enhanced accuracy.

Moreover, if the switching rate of the differential output signal Vout is increased, the possibility of causing erroneous judgment by the latch circuit 10 increases. As mentioned above, the differential output signal Vout is outputted from the latch circuit. Consequently, the latch circuit 30 is suitably used for latching the differential input signal Vin with smaller amplitude and higher frequency (e.g., 14 Gigabit/sec).

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A latch circuit, comprising:
    a symmetric circuit;
    a clock receiving circuit receiving a first clock signal and a second clock signal, wherein a phase difference between the first clock signal and the second clock signal is 180 degrees;
    a current generating circuit directly electrically connected with the symmetric circuit and the clock receiving circuit, and providing a discharge current;
    a sampling circuit directly electrically connected with the current generating circuit, wherein according to the first clock signal, the sampling circuit receives a differential input signal and the discharge current flows through the sampling circuit; and
    a holding circuit directly electrically connected with the current generating circuit, wherein according to the second clock signal, the discharge current flows through the holding circuit and the holding circuit generates a differential output signal.

2. The latch circuit as claimed in claim 1, wherein the differential input signal contains a first input signal and a second input signal, and the differential output signal contains a first output signal and a second output signal, wherein the latch circuit further comprises:
    a first input node, electrically connected with the sampling circuit;
    a second input node electrically connected with the sampling circuit, wherein when the first clock signal is in a high level state, the sampling circuit receives the first input signal at the first input node and receives the second input signal at the second input node;
    a first output node, electrically connected with the holding circuit; and
    a second output node, electrically connected with the holding circuit, wherein when the second clock signal is in the high level state, the holding circuit generates the first output signal at the first output node and generates the second output signal at the second output node.

3. The latch circuit as claimed in claim 2, wherein the sampling circuit comprises:
    a first switch element electrically connected with the current generating circuit, the first input node and the first output node, wherein the first switch element is selectively turned on or turned off according to the first input signal, so that a voltage at the first output node is correspondingly changed; and
    a second switch element electrically connected with the current generating circuit, the second input node and the second output node, wherein the second switch element is selectively turned on or turned off according to the second input signal, so that a voltage at the second output node is correspondingly changed.

4. The latch circuit as claimed in claim 2, wherein the holding circuit comprises:
    a third switch element electrically connected with the current generating circuit, the first output node and the second output node, wherein the third switch element is selectively turned on or turned off according to the first output signal, so that a voltage at the second output node is correspondingly changed; and a fourth switch element electrically connected with the current generating circuit, the first output node and the second output node, wherein the fourth switch element is selectively turned on or turned off according to the second output signal, so that a voltage at the first output node is correspondingly changed.

5. The latch circuit as claimed in claim 1, wherein the clock receiving circuit comprises:

a fifth switch element electrically connected with the current generating circuit, wherein when the first clock signal is in a high level state, the fifth switch element is turned on, so that the discharge current flows through the fifth switch element; and a sixth switch element electrically connected with the current generating circuit, wherein when the second clock signal is in the high level state, the sixth switch element is turned on, so that the discharge current flows through the sixth switch element.

6. The latch circuit as claimed in claim 1, wherein the current generating circuit comprises:

a source circuit for generating a source current; and a mirroring circuit electrically connected with the source circuit, the sampling circuit and the holding circuit, and generating a first mirror current or a second mirror current, wherein a magnitude of the first mirror current or the second mirror current is equal to a multiple of a magnitude of the source current, wherein the first mirror current flows through the sampling circuit in a sampling mode, and the second mirror current flows through the holding current in a holding mode.

7. The latch circuit as claimed in claim 6, wherein the mirroring circuit comprises:

a seventh switch element electrically connected with the sampling circuit and the clock receiving circuit, wherein when the seventh switch element is turned on according to a bias voltage, the seventh switch element generates the first mirror current corresponding to the source current; and an eighth switch element electrically connected with the holding circuit and the clock receiving circuit, wherein when the eighth switch element is turned on according to the bias voltage, the eighth switch element generates the second mirror current corresponding to the source current.

8. The latch circuit as claimed in claim 7, wherein when the sampling circuit is turned on according to the first clock signal, the first mirror current is the discharge current flowing through the sampling circuit, wherein when the holding circuit is turned on according to the second clock signal, the second mirror current is the discharge current flowing through the holding circuit.

9. The latch circuit as claimed in claim 7, wherein the source circuit comprises a ninth switch element, wherein a drain terminal and a gate terminal of the ninth switch element are connected with each other, wherein the ninth switch element is turned on according to the bias voltage.

10. The latch circuit as claimed in claim 6, wherein the symmetric circuit comprises a tenth switch element, wherein the tenth switch element is electrically connected with the source circuit and a supply voltage, and the tenth switch element is continuously turned on according to the supply voltage.

* * * * *